US005580650A

United States Patent [19]

Forgach et al.

[11] Patent Number: 5,580,650

[45] Date of Patent: Dec. 3, 1996

[54] PROCESS OF PREPARING A COMPOSITE MEMBRANE

[75] Inventors: David J. Forgach; J. Keith Harris; Paul G. Glugla; Donald L. Schmidt; Richard F. Fibiger, all of Midland, Mich.

[73] Assignee: The Dow Chemical Company, Midland, Mich.

[21] Appl. No.: 492,267

[22] Filed: Jun. 19, 1995

Related U.S. Application Data

[63] Continuation-in-part of Ser. No. 110,605, Aug. 23, 1993, abandoned, which is a continuation-in-part of Ser. No. 920,029, Jul. 27, 1992, Pat. No. 5,310,581, which is a continuation of Ser. No. 459,085, Dec. 29, 1989, abandoned.

[51] Int. Cl.[6] .......... B32B 3/26

[52] U.S. Cl. .......... 428/304.4; 427/407.1; 427/430.1; 427/495; 428/336; 428/339; 428/411.1

[58] Field of Search .......... 427/595, 430.1, 427/407.1; 428/336, 304.4, 339, 411.1

[56] References Cited

U.S. PATENT DOCUMENTS

| | | | |
|---|---|---|---|
| 4,113,912 | 9/1978 | Okita | 428/290 |
| 4,466,931 | 8/1984 | Tanny | 264/22 |
| 4,797,187 | 1/1989 | Davis et al. | 204/180.2 |
| 4,839,203 | 6/1989 | Davis et al. | 427/244 |
| 4,906,374 | 3/1990 | Gsell | 210/490 |
| 4,976,897 | 12/1990 | Callahan et al. | 264/22 |
| 5,006,624 | 4/1991 | Schmidt et al. | 526/243 |
| 5,102,552 | 4/1992 | Callahan et al. | 210/654 |
| 5,126,189 | 6/1992 | Tanny et al. | 428/220 |
| 5,145,584 | 9/1992 | Swamikannu | 210/650 |
| 5,158,721 | 10/1992 | Allegrezza, Jr. et al. | 264/22 |
| 5,238,747 | 8/1993 | Schmidt et al. | 428/421 |

FOREIGN PATENT DOCUMENTS

| | | |
|---|---|---|
| 0257635 | 3/1988 | European Pat. Off. . |
| 0316525 | 5/1989 | European Pat. Off. . |
| 0321241 | 6/1989 | European Pat. Off. . |
| 9118666 | 12/1991 | WIPO . |

*Primary Examiner*—Bernard Pianalto

[57] ABSTRACT

A process is disclosed for the formation of a high flux composite membrane having a thin discriminating film affixed to a porous support layer through a glue layer. The process comprises the formation of the discriminating film by irradiating an aqueous polymer solution in the substantial absence of drying and under conditions which are sufficient to form a polymer film on the surface of the polymer solution at the interphase of the solution and a blanketing fluid. The film is then affixed to the support through the glue layer which may be the same polymer solution from which the discriminating film is formed.

13 Claims, No Drawings

PROCESS OF PREPARING A COMPOSITE MEMBRANE

CROSS REFERENCE TO RELATED APPLICATIONS

This application is a continuation in part of Application, Ser. No. 08/110,605, filed Aug. 23, 1993, now abandoned, which is a continuation in part of Ser. No. 07/920,029, filed Jul. 27, 1992, which issued as U.S. Pat. No. 5,310,581, on May 10, 1994, which is a continuation of Ser. No. 07/459, 085, filed Dec. 29, 1989, now abandoned.

BACKGROUND OF THE INVENTION

The present invention is related to composite membranes useful in fluid separations and methods for their preparation.

Semipermeable composite membranes prepared from various synthetic polymeric compositions are used in various commercial and industrial applications for the separation of various components found in liquids or gases. Reverse osmosis and nanofiltration membranes are typically relatively thin in order to provide a relatively high rate of transport of the liquid or gas through the membrane, i.e., high flux rate.

Composite membranes having an ultraviolet (UV) curable polymeric film coating as a discriminating layer laminated onto a porous support material have been made and shown to be somewhat useful in the separation of liquids and gases, for example, as in U.S. Pat. No. 4,976,897. In this patent, a composite membrane is prepared by first coating a porous support with a resin mixture having a high viscosity due to a high molecular weight, i.e., the viscosity is at least about 35,000 to 500,000 centipoise, in order that a significant amount of the pores of the support are not filled. The coated support is then cured with UV light to form a discriminating layer on the support. Because of the high viscosity of the resin mixture, the resulting discriminating layer generally has a thickness of 60,000 Angstroms or greater.

Membranes having discriminating layers of 60,000 Angstroms or greater are not optimum for many liquid separation applications. This is due to the fact that thicker membranes usually inhibit flux. Therefore, it would be desirable to have a process which produces a UV cured composite membrane having a thinner discriminating layer in order to maximize the flux.

SUMMARY OF THE INVENTION

The present invention is directed to a composite membrane which comprises substantially three layers. The first is a polymeric discriminating film, the second is a glue layer and the third is a porous support. The discriminating film is formed by irradiating a substantially aqueous low molecular weight, i.e., from about 20,000 to about 50,000 daltons, low viscosity, i.e., less than about 100 centipoise, polymer in a film forming solution which is in contact with a blanketing fluid, under conditions which are sufficient to form the discriminating film which has a thickness of from about 500 to about 10,000 Angstroms, preferably from about 500 to about 5000 Angstroms, more preferably from about 500 to about 1000 Angstroms, on the surface of the polymer solution at the interphase of the solution and the blanketing fluid. The discriminating film is then contacted with a glue layer on the porous support, and before substantial drying of the film occurs, the discriminating film is affixed to the porous support through the glue layer. Thus, a discriminating layer of the three layered composite membrane is formed from the film. Alternatively, the contacting and affixing of the discriminating film through the glue layer to the porous support may occur simultaneously, as long as substantial drying of the film forming solution has not occurred before it is affixed to the porous support. In a preferred embodiment of the invention, a layer of the polymer solution that forms the discriminating film also serves as the glue layer.

The membranes of the present invention can be made to exhibit a variety of molecular weight cut offs. Molecular weight cutoff or MWCO is the greatest molecular weight of a solute of which greater than 95 percent will be rejected by the membrane. The MWCO may be varied, as hereinafter described, by altering the process for the preparation of the membrane rather than by altering the polymer in the solution from which the discriminating film is formed. The membranes made by the process of the present invention preferably have MWCOs ranging from 150 to 2000 daltons.

Further, the present invention largely avoids the use of organic solvents and surfactants. Additionally, the membranes of the present invention are resistant to degradation by chlorine and other oxidizers.

DETAILED DESCRIPTION OF THE ILLUSTRATIVE EMBODIMENTS

The discriminating film layer of the membrane of the current invention is prepared by irradiating a substantially aqueous polymer solution under conditions such that a thin film is formed on the surface of the polymer solution at the interphase of the solution and a blanketing fluid which is immiscible with the polymer solution. Typically, the polymer solution is open to the air and the film is formed at the air/solution interphase. However, the blanketing fluid may be an atmosphere other than air or it may be a liquid which is transparent to radiation and which does not interfere with the formation of the discriminating layer, i.e., hexane.

The polymer solution from which the discriminating film is formed is substantially aqueous and consequently has a waterlike viscosity of typically less than about 100 centipoise, preferably less than about 10 centipoise, in order to limit the thickness of the discriminating film and for ease of handling of the polymeric solution. The polymer solution should not contain excess cosolvents or surfactants. Although the specific amounts of cosolvents or surfactants that are excess will vary depending upon the polymer or polymers, solvent or solvents, and surfactant or surfactants present, generally, the amount of cosolvents and surfactants in the solution should not be so great that the polymer is prevented from reaching the interphase and forming a film upon irradiation.

The discriminating film is formed at the surface of the aqueous polymer solution and may then be recovered and affixed through a glue layer to an appropriate porous support. It is necessary to avoid a substantial amount of drying of the film forming solution before affixing the film to the porous support. By substantial amount of drying, it is meant that the solution should not become so dry that a film does not form at the interphase or so dry that the film will not become affixed to the support. A film will not form if the polymer precipitates and is no longer soluble in the polymer solution, i.e., the polymer becomes dry or forms a gel and the polymer precipitate interferes with film formation at the interphase of the solution and blanketing fluid. Therefore, typically, the polymer concentration should be less than about 30 weight percent of the solution, preferably less than about 4 weight percent of the solution.

In a preferred embodiment, the membrane of the present invention is prepared in a process comprising the following steps:

(1) contacting a porous support with at least one aqueous polymer solution which contains from about 0.01 to about 10 weight percent polymer in an aqueous solvent;

(2) irradiating the polymer solution under conditions such that a discriminating film having a thickness of about 500 to about 10,000 Angstroms is formed at the blanketing fluid/solution interphase; and before substantial drying of the polymer solution occurs;

(3) affixing the discriminating film through a glue layer to the porous support to form the composite membrane.

In addition to these essential steps, the process may comprise additional steps. In preparation of the membrane, it is desired that the support be "wet", i.e., has a surface energy such that a film may be deposited onto the surface of the support. It is also desired that the discriminating film be adhered to the support sufficiently to prohibit unrestrained swelling of the discriminating film and to prevent loss of the discriminating film by physical delamination. Depending on the particular support and discriminating film used, this may be accomplished by utilizing a single polymer solution that performs all the desired functions, i.e., forms a discriminating film and serves as a wetting solution and a glue layer which may sink into the pores of the support to affix the film to the support. Alternatively, the support may be coated with different solutions. For example, it may be desirable to contact a support with a wetting solution in order to facilitate interaction between the support and the film forming solution and allow the film to be deposited onto the substrate, then a polymer solution that forms the basis for a glue layer which, at a minimum, functions to adhere the discriminating film to the support sufficiently to prohibit unrestrained swelling of the discriminating layer and to prevent physical delamination of discriminating film from the support; and then a polymer solution from which the discriminating film is formed.

Depending on the support and polymer solutions used, the "wetting" solution, the "glue" solution and the film-forming polymer solution may be the same polymer solution and may be applied in a single layer or in multiple layers. Alternatively, the solutions may use the same dissolved polymer or mixture of polymers, but use a different solvent or a different polymeric concentration. Alternatively two or more different polymer solutions may be used. In one alternative embodiment, the process comprises the following steps:

(1) contacting a porous support with a wetting solution;

(2) contacting the wet support with a glue layer forming polymer solution which contains from about 0.01 to about 10 weight percent polymer in an aqueous solvent;

(3) contacting the wet support having a glue layer with a discriminating film forming polymer solution having a viscosity of less than about 100 centipoise which contains from about 0.01 to about 10 weight percent polymer in an aqueous solvent;

(4) irradiating the discriminating film forming polymer solution under conditions such that a discriminating film having a thickness of about 500 to about 10,000 Angstroms is formed at the blanketing fluid/solution interphase; and before substantial drying of the film forming polymer solution or the glue layer forming polymer solution occurs;

(5) affixing the discriminating film through the glue layer to the porous support to form the composite membrane.

In another alternative embodiment, the process comprises the following steps:

(1) contacting a porous support with a glue layer forming polymer solution which contains from about 0.01 to about 10 weight percent polymer;

(2) contacting the porous support having a glue layer with a discriminating film forming polymer solution which contains from about 0.01 to about 10 weight percent polymer in an aqueous solvent;

(3) irradiating the discriminating film forming polymer solution under conditions such that a discriminating film having a thickness of about 500 to about 10,000 Angstroms is formed at the blanketing fluid/solution interphase; and before substantial drying of the film forming polymer solution occurs or the glue layer forming polymer solution (4) affixing the discriminating film through the glue layer to the porous support to form the composite membrane.

Prior to forming the discriminating film, film-forming polymer solutions, wetting solutions, and glue layers may be applied to the support by techniques known to one skilled in the art. Conventional techniques include adsorption, dipping, casting, spraying, wiping, rolling, or filtration of the coating solution through the substrate. Excess coating may be removed by draining or drawing a smooth instrument such as a blade or roller across the surface. The temperature of the coating solutions are selected so as to avoid conditions detrimental to the resulting membrane. Other than as discussed herein, operating parameters for applying the polymer solutions are not critical so long as the resulting membrane is not deleteriously affected. Ambient temperatures, i.e., from about 10° to about 30° C. are generally convenient although other temperatures are operable, i.e., from about 0° to about75° C.

The support is typically porous and does not significantly impede the transport of fluids across the membrane as compared to the discriminating film/layer. It is used to provide mechanical strength to the membrane. Examples of suitable supports include a microporous polymer such as polysulfone, polyethersulfone, polycarbonate, polyvinylidene chloride, Nylon, polyetherether ketone, polybenzimidazole, cellulose acetate or other cellulose esters.

The manner in which the discriminating film is affixed to the support is not critical to the present invention so long as the resulting membrane has the desired characteristics. The discriminating film may be affixed through chemical or physical means. Methods known to those skilled in the art may be used such as drying or acid catalyzed condensation. Activation of a thermally sensitive crosslinking agent is also a suitable method. Affixation may be accomplished in a step subsequent to the formation of the discriminating layer, in which the membrane is subjected to elevated temperatures in, for example, an oven in a temperature range from about 50° C. to about 200° C., more preferably from about 75° C. to about 150° C. In an alternative embodiment, the discriminating film may be affixed to the support as a result of heat that is incidental to the irradiation to form the discriminating film. In either case, the discriminating film must be in contact with the support before the heat will cause the discriminating film to adhere to the support.

The polymer used in the discriminating layer polymer solution must be capable of film formation upon exposure to radiation. The polymer must also be surface active in that it is necessary that the surface concentration of the polymer in the discriminating layer polymer solution be sufficient to form a surface film. Multi-component polymers, such as those useful in the present invention, usually consist of different monomeric units each of which contributes a desired characteristic to the resulting polymer and ultimately to the finished membrane.

In order to impart the desired properties to the membrane discriminating layer, polymeric reactants may contain other groups in the repeating unit in addition to the moiety directly bearing or including the reactive cationic or nucleophilic group, provided these groups do not adversely affect the membrane or its formation. For example, in cationic vinyl addition polymers, such methacrylate derivatives as

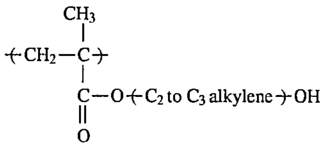

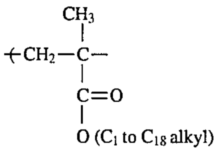

and

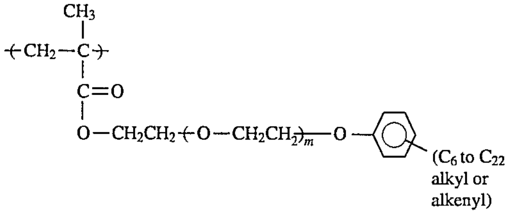

wherein m is an integer from 1 to 20, may be present to advantage in membranes for reverse osmosis.

Photosensitivity in the polymer is preferably obtained by the presence of onium groups on the polymer backbone. Known onium groups include aryl cationic moieties, which have been described as photoacid generating initiators in the prior art. For example, *The Chemistry of the Sulfonium Group*, edited by C. J. M. Stirling and S. Patai, pp. 107–122, John Wiley & Sons (1981), describes the photochemistry of sulfonium compounds. *Advances in Polymer Science,* 62, pp. 1–48, Springer-Verlag Berlin, Heidleberg (1984), describes the cationic polymerization using iodonium or sulfonium salt photoinitiators. It has been found that in preferred embodiments, the polymer bearing a plurality of photolabile onium groups will react at ambient temperatures with even weakly reactive nucleophile groups, such as amides, urea moieties or sulfonic acid salts.

Preferred photolabile onium groups include substituted or unsubstituted sulfonium, quaternary ammonium, phosphonium, pyridinium, thiazolinium, imidazolinium or azetidinium groups. Substituted or unsubstituted tertiary amines, cyclic amines, and aromatic amines may also be employed. Diazonium groups are not onium groups as the term is used herein. Techniques and processes for making compounds bearing the desired moieties are well known in the prior art. U.S. Pat. Nos. 2,676,166; 2,891,025; 3,269,991; 3,329,560; 3,429,839; 3,544,499; 3,636,052; 3,723,386; 3,962,165; 4,002,586; 3,804,797; 4,337,185, 4,483,073; 4,426,489; 4,444,977 and 4,477,640 are incorporated herein by reference to illustrate techniques for making such compounds. Especially preferred as photolabile oniums are those containing a sulfonium, quaternary ammonium or phosphonium group. Preferably, the substituents on the photolabile onium are each independently hydroxyalkyl, phenyl or alkyl groups or are heterocyclic saturated moieties which include the onium in the ring. Most preferably, the photolabile onium group is bonded to the $-(CH_2)-$ moiety of a benzyl group and is a dialkyl sulfonium, trialkyl phosphonium or trialkyl ammonium moiety wherein each alkyl has from about 1 to about 16 carbon atoms or is a sulfonium, alkyl phosphonium or alkyl ammonium where two of the valences are part of a five- or six-member ring including the onium.

The chromophore group is preferably an aromatic group. The chromophore group may be joined to the onium moiety by a linking group advantageously selected from methylene, i.e., ($-CH_2-$), ethylidene (i.e.,

 ) or 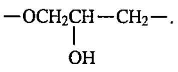.

Especially preferred as a chromophore is a phenyl group which is pendant from a polymer backbone. Especially preferred as a linking group is methylene or

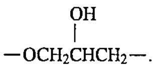.

Preferably, the benzyl onium salt groups are part of a a vinyl addition polymer. Such polymers can readily be prepared by conventional vinyl addition polymerization of vinyl benzyl chloride with other compatible monomers followed by reaction of the benzyl chloride with a suitable onium precursor. For example, dialkyl sulfide will react with the benzyl chloride group pendant from a vinyl addition polymer to form a dialkyl sulfonium group. Tertiary amines or $PW_3$ compounds, wherein W at each occurrence is independently alkyl, phenyl or hydroxalkyl, will react with benzyl chloride in a similar manner. Alternatively, a polystyrene or styrene copolymer can be chloromethylated via conventional techniques to introduce benzyl chloride groups. The benzyl chloride groups can then the converted to onium groups as described hereinbefore for the vinyl benzyl chloride polymers.

The anion associated with the photolabile onium group is advantageously selected so as to promote reaction between the photolabile onium group and the nucleophile group present, when exposed to radiation. Any anion is operable so long as the reaction is not deleteriously affected. Preferably, inner salts or more preferably, partial inner salts of onium compounds can be employed, such as a polymer bearing both carboxylate and photolabile onium groups. In general, it is preferred that the anion be a relatively strong conventional nucleophile or strong base. Some anions, such as hydroxide, in some embodiments will also make a sulfonium or certain other onium groups more susceptible to the competing hydrolysis. The counterion can be readily changed by contacting the compound bearing onium group with an appropriate ion exchange resin in the conventional manner to effect conversion to the desired anion.

The presence of hydrophobic groups and, in addition to the cationic groups, other hydrophilic moieties can also affect the selectivity, integrity, and permeability of the ultimate product. For example, the discriminating layer polymer solution must form thin, uniform films on a substrate. The polymer used in this solution must be surface active in that it is necessary that the surface concentration of the polymer in the discriminating layer polymer solution be sufficient to form a surface film. Additional polymers useful in preparing the discriminating layer are described in U.S. Pat. No. 5,238,747 and U.S. Pat. No. 5,310,581 which are herein incorporated by reference thereto.

A preferred class of photoreactive systems is represented by Formula I

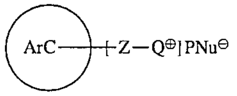

(I)

where illustrative embodiments of ArC, Z, $Q^{\oplus}$ and $PNu^{\ominus}$ are presented in Table A.

TABLE A

| ArC | Z | $Q^{\oplus}$ | $PNu^{-}$ |
|---|---|---|---|
| 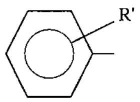 | $-CH_2-$ | 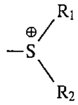 | $Cl^{\ominus}$ $OH^{\ominus}$ $^{\ominus}OR$ $\overset{\ominus}{CO_3}$ $\overset{\ominus}{HCO_3}$ |
| 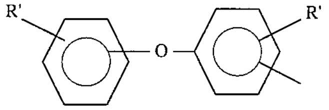 | | 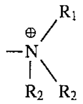 | 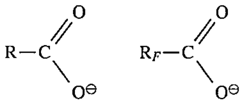 |
| 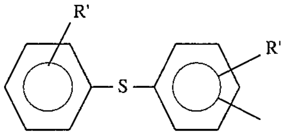 | 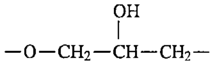 | 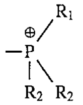 | 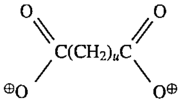 $R_FO^{\ominus}$ |
| 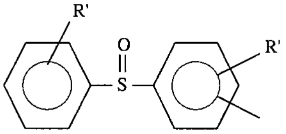 | | 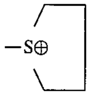 | $H_2PO_4^{\ominus}$ 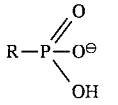 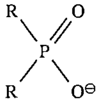 |
| 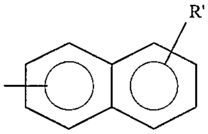 | | 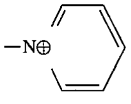 | 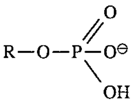 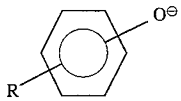 |
| 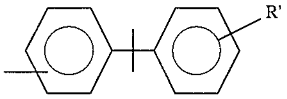 | | 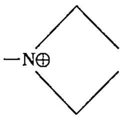 | 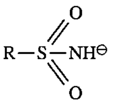 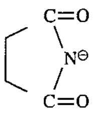 |

In Table A, each moiety at each occurrence is independently selected from the group consisting of R'=a polymer or copolymer backbone optionally inertly substituted or bearing a plurality of $Q^{\oplus}$ and/or $PNu^{\ominus}$;

$R_1$ and $R_2$ are each independently hydrogen $C_1$-$C_{18}$ alkyl, or $-CH_2(CH_2)_uOH$, preferably $CH_3$ or tertiary-butyl, where u=1 to 12;

$R_F$ is a fluorinated alkyl.

$R_F$ may be an alkyl which is not fully fluorinated, but no more than one atom of hydrogen or chlorine should be present in place of fluorine for each carbon atom.

$R_F$ is preferably $-(CF_2)_vCF_3$, where v is an integer from 1 to 12, more preferably from 6 to 12, or $R_F$ is preferably $-(CH_2)_x-(CF_2)_yF$, where x is an integer 1 or 2 and y is an integer from 1 to 12, more preferably from 6 to 12; and R=$C_1$ to $C_{18}$ alkyl, phenyl or a polymer or copolymer which is optionally inertly substituted or bears a plurality of $Q^{\oplus}$ and/or $PNu^{\ominus}$.

The photoreactive moiety, ArC-Z-$Q^{\oplus}$, may be used as a low molecular species, for example

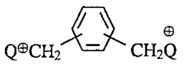

-continued

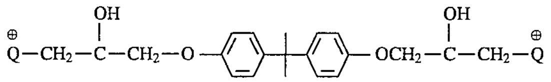

The photoreactive moiety is preferably attached to a polymer, either as a pendant group or as an end group. For example, a class of polymers can be represented by Formula II:

$$A-[(B)_m(C)_n(D)_o]_p-E \qquad (II)$$

A and E are each terminal groups resulting from a vinyl polymerization, and B, C and D are internal covalently bonded groups which can be arranged in any sequence. The subscripts m, n and o represent molar ratios and m+n+o=1.00 where m is in the range from about 0.03 to about 1.00, n is in the range from 0 to 0.97 and o is in the range from 0 to 0.96. The subscript p is the average degree of polymerization, preferably from about 2 to 1,000, more preferably from about 100 to about 1000.

In Formula II, B is a photoreactive moiety which has the formula $R^q$-Y-ArC-Z-$Q^{\oplus}$ wherein $R^q$ is a group which includes a carbon-carbon single bond formed during vinyl addition polymerization of the polymer and Y is a chemical bond or a noninterfering, bivalent moiety. ArC is a chromophore, Z is a linking group and $Q^{\oplus}$ a photolabile onium as defined hereinbefore. Preferably $R^q$ is the residue of an ethylenically unsaturated monomer, more preferably $-[CH_2-CH]-$or

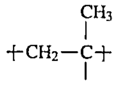

and Y is a chemical bond (in which case B is $R^q$-ArC-Z-$Q^{\oplus}$) or a noninterfering connecting group, such as

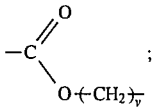

;

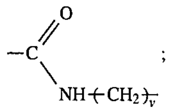

;

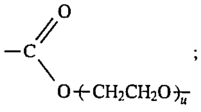

;

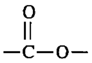

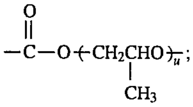

; $-(CH_2CH_2O)_u-$ and

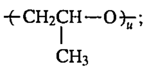

;

wherein u is independently at each occurrence an integer from 1 to 20 and v is an integer from 1 to 12, but preferably 1. Illustrative examples of B include

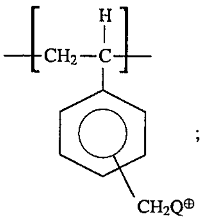

;

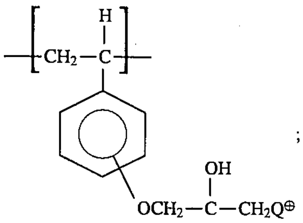

; or

-continued

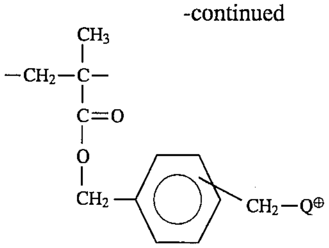

In Formula II, "C" is a group derived from an ethylenically unsaturated monomer which has the formula:

$R^p$-Y'-PNu where $R^p$ is a residue of an ethylenically unsaturated monomer, PNu (as defined hereinbefore as an anion or nucleophile and exemplified in Table A), and Y' is a chemical bond, in which case "C" is $R^p$-PNu, or Y' is a noninterfering group, such as $-C(O)-(CH_2)_u$ or $-C(O)O(CH_2)_u-$ wherein u is an integer from 1 to 20. Illustrative of "C" are

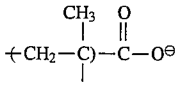

or

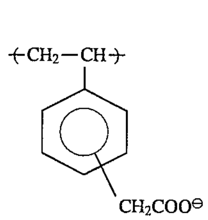

In Formula II D has the formula

where $R^h$ is an organic group and the residue from a polymerized ethylenically unsaturated monomer, more preferably

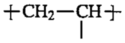

or

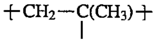

and G is an organic noninterfering group, such as

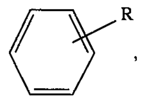

,

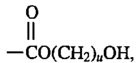

,

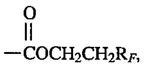

,

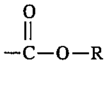

or

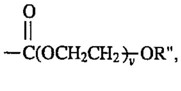

, wherein R is as previously defined for Table A, $R_F$ is as previously defined for Table A, R'' is a $C_1$ to $C_{18}$ alkyl or aralkyl, and u is an integer from 1 to 20 and v is an integer from 1 to 40.

A and E in Formula II are each independently end groups consistent with vinyl addition polymerization. Illustrative end groups are $CH_3(CH_2)S$—, H—, $CH_3^-$, $(CH_3)_3CO$—, Cl— and —OH.

In another embodiment of the subject invention, polymeric solutions can be prepared in situ from polymerizable moieties bearing at least one nucleophilic or onium group. For example, vinylbenzyl chloride, hydroxyethylmethacrylate and methacrylic acid can be copolymerized using a free radical initiator.

In general, after the polymers bearing onium groups or nucleophilic groups are prepared it is desirable to separate the oligomers with a molecular weight of less than 6,000 daltons so that only higher molecular weight polymers are used as the discriminating layer and the glue layer. Oligomers can be conveniently separated by use of conventional dialysis techniques or ultrafiltration membranes.

The polymers bearing onium and/or nucleophilic groups can optionally be derived from unsaturated moieties bearing other compatible groups. In some instances it may be desirable to use such compatible monomers in order to enhance certain properties of the resulting compounds, such as their hydrophobic or hydrophilic properties, their film-forming properties or glass transition temperature. For example, nonylphenoxy polyoxyethylene (10) methacrylate (9N10MA) or other surface active monomers can be used to render the polymer more wetting. Other compatible monomers include a $C_1$ to $C_{12}$ alkyl methacrylate or hydroxyethyl methacrylate. Preferably, the polymeric solutions display a good combination of properties. For example, it is desirable that said compound is soluble or dispersible in aqueous media. At the same time the compound should be sufficiently wettable such that it can readily be deposited on the substrate on which the compounds are to be reacted.

In a preferred embodiment, the polymer used to form the discriminating film layer is a terpolymer of hydroxyethyl methacrylate, vinylbenzyldimethyl sulfonium salt and methacrylic acid or a terpolymer of hydroxyethyl methacrylate, methacrylic acid and vinylbenzyltrimethyl ammonium salt. Useful salts include those of halides. A preferred salt is that of chloride.

As discussed above, it may be desired to use a separate solution to "wet" the support to facilitate interaction between the support and other coating solutions. Those skilled in the art will recognize that various solutions are suitable for this. Examples of useful solutions include dilute alcohol solution and various polymer solutions. As discussed herein, the polymer solution useful in the formation of the discriminating film layer may be used.

The glue layer serves to affix the discriminating film layer to the support. To accomplish this, the glue layer polymer solution is preferably capable of insolubilization. Insolubilization may be accomplished, for example, by reaction with the solvent or via subsequent crosslinking and forming covalent bonds with residual reactive groups in the discriminating film. It should be noted that in the alternative, or in conjunction with the glue layer polymer solution, any unreacted portion of the discriminating film polymer solution also serves to affix the discriminating film to the support. By unreacted in this context, it is meant any portion of the discriminating film polymer solution which does not form the discriminating film at the air/blanketing layer interphase upon irradiation.

Various polymers are suitable for use in the glue layer polymer solution, so long as they serve this purpose and do not detrimentally affect the finished membrane. The polymers may be multi-component polymers. Multi-component polymers usually consist of different monomeric units each of which contributes a desired characteristic to the resulting polymer and ultimately to the finished membrane. For example, monomers may be used which contribute nucleophilic groups for reacting with or crosslinking through a cationic group, enhance the hydrophobic or hydrophilic properties of the membrane, exert a special affinity for the species which is to be separated using the finished membrane or adjust the mechanical properties of the resulting membrane.

The polymer in the glue polymer solution may be the same as or different from the polymer in the discriminating film forming polymer solution and can be selected from those discussed herein in connection with the discriminating film polymer solution. Other suitable polymers are well known to those skilled in the art and include those discussed in, for example, U.S. Pat. No. 4,839,203 to Davis et al. issued Jun. 13, 1989.

When a polymer solution is used as a wetting solution, the polymer concentration is preferably from 0.01 to 10 weight percent. The solvent system is usually aqueous or water miscible. Suitable water miscible solvents include lower alkanols and alkylene glycols.

It is preferred that the discriminating film is formed by exposure to ultraviolet (UV) radiation, although other types of radiation may be used. The preferred dose of UV radiation is from about 0.1 to about 10 joules/$cm^2$ although any dosages which result in the preparation of the membranes of this invention are acceptable. If the dosage is too low, the film formed is too thin and thus lacks the necessary mechanical strength to be useful. If the dosage is too high, it results in a thick, brittle film and results in a membrane having undesirably low flux. Other types of penetrating radiation are useful, but less preferred. These include gamma radiation or X-rays.

The discriminating film of the membranes of this invention is generally very thin. The discriminating film is typically about 500 to 10,000, preferably about 500 to 5,000, more preferably about 500 to 1,000, Angstroms in thickness.

The MWCOs of the composite membranes of the present invention are altered by adjusting the concentrations of the polymer solutions used in the production of the membranes and/or modifying the radiation dosage and the identity and concentration of the glue layer.

The properties of the composite membranes of this invention will vary with their MWCOs. Generally, membranes having a lower MWCO will have pure water fluxes lower than those of higher MWCO. For example, a membrane having a MWCO of about 60 daltons or less generally should have a pure water flux of greater than about 10 gallons per square foot of membrane per day (gfd) at 250 psi. Membranes with a MWCO of about 200 daltons generally should have a pure water flux of greater than about 25 gfd at 250 psi.

Membrane devices of the spiral, tubular hollow fiber or plate and frame configuration can be fabricated from the membranes prepared as described herein. These devices are assembled in accordance with conventional techniques once the membrane is prepared.

The following examples are provided to illustrate the invention and should not be considered as limiting its scope.

EXAMPLE 1- PREPARATION OF MEMBRANE

A polymerization initiator, 2,2'-azobis-isobutyronitrile was used to initiate free radical polymerization of 2-hydroxyethylmethacrylate, vinylbenzyl chloride and methacrylic acid in tetrahydrofuran. After polymerization was complete, approximately 1.2 equivalents of dimethyl sulfide per equivalent of vinylbenzyl chloride was added to the polymer solution. The solution was then heated to promote the conversion of the benzyl chloride moiety to benzylsulfonium chloride. Water was added to the reaction mixture as necessary to keep the polymer soluble. The tetrahydrofuran and residual dimethyl sulfide were removed from the polymer solution under reduced pressure. The aqueous solution was then dialyzed against deionized water using dialysis tubing. The polymer solution was stored at 4° C. until used.

A polysulfone ultrafiltration support was made by casting a 15 weight percent solution of polysulfone in dimethyl formamide on a glass plate with 0.005 inch doctor blade and quickly immersing the plate in a water bath at room temperature. This membrane was used as the support in the composite membrane synthesis.

An aqueous solution containing 0.1 weight percent of the polymer made as described above and 3 weight percent of $H_2SO_4$ was placed in a dish. A 2 inch diameter disk of the polysulfone support was submerged under the solution which was maintained at room temperature. The solution was irradiated with a 450 W Ace-Hanovia 7825-34 UV lamp. The total dose of radiation delivered between 200 nm and 700 nm wavelength was 4 joules/cm$^2$. The irradiation caused the formation of a thin polymer film at the air/solution interface. The film was loosened from the edge of the dish. The volume of the solution below the film was increased four times by the addition of water through a syringe. The submerged support was drawn up through the film to laminate the film onto the support which was then placed for one hour in an oven pre-heated to 90° C. Next, a 1.5 inch diameter disk was cut out of the support. This disk was placed in a solution of 1:1 weight:weight isopropanol and water to rewet the polysulfone support. The disk was then immersed in deionized water for a few minutes and then assembled into a reverse osmosis test cell.

To measure the rejection of glucose oligomers of degree of polymerization from 1 to 9 by the membrane of the invention, the reverse osmosis membrane test cell was placed on a test line circulating a 5 percent aqueous solution of Clear DFX 28 AF-42 corn syrup. The feed pressure was maintained at 125 pounds per square inch (psi) and the recovery at <1 percent. The feed and permeate were analyzed by liquid chromatography using an Econosphere NH2U cartridge attached to a refractive index detector. This cartridge separated the glucose oligomers by size. The response of the refractive index detector was proportional to the glucose oligomer concentration in the original solution. Glucose oligomer rejections were calculated as 1-(peak height of permeate/peak height of feed) for each successive peak appearing in the chromatogram.

Aqueous solutions of NaCl and aqueous solutions of $MgSO_4$ were tested similarly to the glucose solutions above except that the conductance of the permeate solutions and feed solutions was measured to determine rejection rather rather than liquid chromatography. Results of NaCl, $MgSO_4$, and glucose solutions having a degree of polymerization from 1 to 9 are shown in Table B. Results are shown in Table B.

EXAMPLE 2

The method of Example 1 was repeated. The results are shown in Table B.

TABLE B

| Examples | Polymer Concentration (percent) | UV Dose (Joules/-Square centimeter) | Post Irradiation Dilution Factor | Flux (gallon/-square foot per day) | NaCl Rejection (percent) | $MgSO_4$ Rejection (percent) |
|---|---|---|---|---|---|---|
| 1 | 0.1 | 4.00 | 4.00 | 36.2 | 58.0 | 89.0 |
| 2 | 0.1 | 4.00 | 4.00 | 49.9 | 32.0 | 56.7 |

| Examples | Glucose Rejection (percent) | $(Glucose)^2$ Rejection (percent) | $(Glucose)^3$ Rejection (percent) | $(Glucose)^4$ Rejection (percent) | $(Glucose)^5$ Rejection (percent) |
|---|---|---|---|---|---|
| 1 | 79.8 | 98.2 | 98.5 | 98.5 | 98.5 |
| 2 | 66.0 | 88.1 | 90.8 | 93.3 | 98.5 |

| Examples | $(Glucose)^6$ Rejection (percent) | $(Glucose)^7$ Rejection (percent) | $(Glucose)^8$ Rejection (percent) | $(Glucose)^9$ Rejection (percent) |
|---|---|---|---|---|
| 1 | 98.5 | 98.5 | 98.5 | 98.5 |
| 2 | 98.5 | 98.5 | 98.5 | 98.5 |

What is claimed is:

1. A process for preparing a composite membrane comprising a discriminating film affixed to a porous support which comprises:

first forming a discriminating film by irradiating an aqueous polymer solution having a viscosity less than about 100 centipoise which is in contact with a blanketing fluid, under conditions which are sufficient to form the discriminating film having a thickness of from about 500 to about 10,000 angstroms on the surface of the polymer solution at the blanketing fluid/polymer solution interphase;

contacting the thus formed discriminating film with a porous support; and then before substantial drying of said polymer solution occurs;

affixing said discriminating film to the porous support through a glue layer.

2. The process of claim 1 comprising the following steps:

(1) contacting a porous support with at least one aqueous polymer solution which contains from about 0.01 to about 10 weight percent polymer in an aqueous solvent;

(2) irradiating the polymer solution under conditions such that a discriminating film having a thickness of about 500 to about 10,000 Angstroms is formed at the blanketing fluid/solution interphase; and then before substantial drying of the polymer solution occurs;

(3) affixing the discriminating film through a glue layer to the porous support to form the composite membrane.

3. The process of claim 2 wherein the blanketing fluid is air or hexane.

4. The process of claim 2 wherein the aqueous polymer solution comprises a terpolymer of hydroxyethyl methacrylate, vinylbenzyldimethyl sulfonium salt and methacrylic acid or a terpolymer of hydroxyethyl methacrylate, methacrylic acid and vinylbenzyltrimethyl ammonium salt.

5. The process of claim 1 comprising the following steps:

(1) contacting a porous support with a wetting solution;

(2) contacting the wet support with a glue layer forming polymer solution which contains from about 0.01 to about 10 weight percent polymer in an aqueous solvent;

(3) contacting the wet support having a glue layer with a discriminating film forming polymer solution having a viscosity of less than about 100 centipoise which contains from about 0.01 to about 10 weight percent polymer in an aqueous solvent;

(4) irradiating the discriminating film forming polymer solution under conditions such that a discriminating film having a thickness of about 500 to about 10,000 Angstroms is formed at the blanketing fluid/solution interphase; and then before substantial drying of the film forming polymer solution or the glue layer forming polymer solution occurs;

(5) affixing the discriminating film through the glue layer to the porous support to form the composite membrane.

6. The process of claim 5 wherein the blanketing fluid is air or hexane.

7. The process of claim 5 wherein the aqueous polymer solution comprises a terpolymer of hydroxyethyl methacrylate, vinylbenzyldimethyl sulfonium salt and methacrylic acid or a terpolymer of hydroxyethyl methacrylate, methacrylic acid and vinylbenzyltrimethyl ammonium salt.

8. The process of claim 1 comprising the following steps:

(1) contacting a porous support with a glue layer forming polymer solution which contains from about 0.01 to about 10 weight percent polymer;

(2) contacting the porous support having a glue layer with a discriminating film forming polymer solution which contains from about 0.01 to about 10 weight percent polymer in an aqueous solvent;

(3) irradiating the discriminating film forming polymer solution under conditions such that a discriminating film having a thickness of about 500 to about 10,000 Angstroms is formed at the blanketing fluid/solution interphase; and then before substantial drying of the film forming polymer solution occurs or the glue layer forming polymer solution;

(4) affixing the discriminating film through the glue layer to the porous support to form the composite membrane.

9. The process of claim 8 wherein the blanketing fluid is air or hexane.

10. The process of claim 3 wherein the aqueous polymer solution comprises a terpolymer of hydroxyethyl methacrylate, vinylbenzyldimethyl sulfonium salt and methacrylic acid or a terpolymer of hydroxyethyl methacrylate, methacrylic acid and vinylbenzyltrimethyl ammonium salt.

11. The process of claim 1 wherein the blanketing fluid is air or hexane.

12. The process of claim 1 wherein the aqueous polymer solution comprises a terpolymer of hydroxyethyl methacrylate, vinylbenzyldimethyl sulfonium salt and methacrylic acid or a terpolymer of hydroxyethyl methacrylate, methacrylic acid and vinylbenzyltrimethyl ammonium salt.

13. A composite membrane useful in liquid separations comprising (a) a discriminating film layer having a thickness of about 500 to about 10,000 Angstroms formed by irradiating an aqueous polymer solution (b) a porous support and (c) a glue layer which affixes the discriminating film layer to the porous support.

* * * * *